US009995801B2

(12) United States Patent
Munson et al.

(10) Patent No.: US 9,995,801 B2
(45) Date of Patent: Jun. 12, 2018

(54) STATIC MULTIPLE-SAMPLE NMR PROBE

(71) Applicant: University of Kentucky Research Foundation, Lexington, KY (US)

(72) Inventors: Eric Jon Munson, Lexington, KY (US); Matthew John Nethercott, Wellington, CO (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 461 days.

(21) Appl. No.: 14/957,142

(22) Filed: Dec. 2, 2015

(65) Prior Publication Data
US 2016/0245883 A1 Aug. 25, 2016

Related U.S. Application Data

(60) Provisional application No. 62/086,300, filed on Dec. 2, 2014.

(51) Int. Cl.
*G01V 3/00* (2006.01)
*G01R 33/30* (2006.01)
*G01R 33/34* (2006.01)

(52) U.S. Cl.
CPC ...... *G01R 33/307* (2013.01); *G01R 33/34092* (2013.01)

(58) Field of Classification Search
USPC ........................................................ 324/309
See application file for complete search history.

(56) References Cited

U.S. PATENT DOCUMENTS

| | | | |
|---|---|---|---|
| 4,654,592 A | 3/1987 | Zens | |
| 5,539,315 A | 7/1996 | Cory et al. | |
| 6,556,013 B2 | 4/2003 | Withers et al. | |
| 6,617,851 B1 * | 9/2003 | Bergmann | G01R 33/34046 324/309 |
| 6,627,461 B2 | 9/2003 | Chapman et al. | |
| 6,696,838 B2 | 2/2004 | Raftery et al. | |
| 6,937,020 B2 | 8/2005 | Munson et al. | |
| 7,081,753 B2 | 7/2006 | Mullen et al. | |
| 7,141,978 B2 | 11/2006 | Peck et al. | |
| 7,436,181 B2 * | 10/2008 | Krahn | G01R 33/307 324/318 |
| 7,439,738 B2 | 10/2008 | Pines et al. | |
| 7,486,078 B1 | 2/2009 | Gerald, II et al. | |

(Continued)

FOREIGN PATENT DOCUMENTS

JP     2009236512 A     10/2009

OTHER PUBLICATIONS

English machine translation of JP2009236512A.

*Primary Examiner* — Rodney Fuller
(74) *Attorney, Agent, or Firm* — King & Schickli, PLLC

(57) ABSTRACT

A static solid-state nuclear magnetic resonance (NMR) probe includes multiple probe subunits each configured for holding a sample. Each probe subunit includes at least an associated magic angle spinning (MAS) module, a radio-frequency (RF) coil and an RF transmission line together defining an RF circuit. Each of the multiple probe subunits is individually held in a conducting housing isolating the RF circuit of the each of the probe subunit from any other of the plurality of probe subunits. The static solid-state NMR probe may include four or more probe subunits including four or more MAS modules.

19 Claims, 5 Drawing Sheets

(56) References Cited

U.S. PATENT DOCUMENTS

| | | |
|---|---|---|
| 7,518,371 B2 | 4/2009 | Spraul et al. |
| 7,535,229 B2 | 5/2009 | Schlueter et al. |
| 7,626,391 B2 * | 12/2009 | Munson ............... G01R 33/422 |
| | | 324/318 |
| 7,915,893 B2 | 3/2011 | Doty et al. |
| 8,106,657 B2 | 1/2012 | Sakellariou et al. |
| 8,212,559 B2 | 7/2012 | Armbruster et al. |
| 8,587,314 B2 * | 11/2013 | Burns ............... G01R 33/34007 |
| | | 324/318 |
| 2002/0149369 A1 * | 10/2002 | Peck .................... G01R 33/302 |
| | | 324/321 |
| 2003/0052677 A1 * | 3/2003 | Pines .................. G01R 33/445 |
| | | 324/307 |
| 2003/0085706 A1 * | 5/2003 | Hasegawa .......... G01R 33/3635 |
| | | 324/322 |
| 2004/0222796 A1 * | 11/2004 | Munson ............... G01R 33/307 |
| | | 324/322 |
| 2005/0233470 A1 | 10/2005 | Clark et al. |
| 2009/0322332 A1 | 12/2009 | Cosman |

* cited by examiner

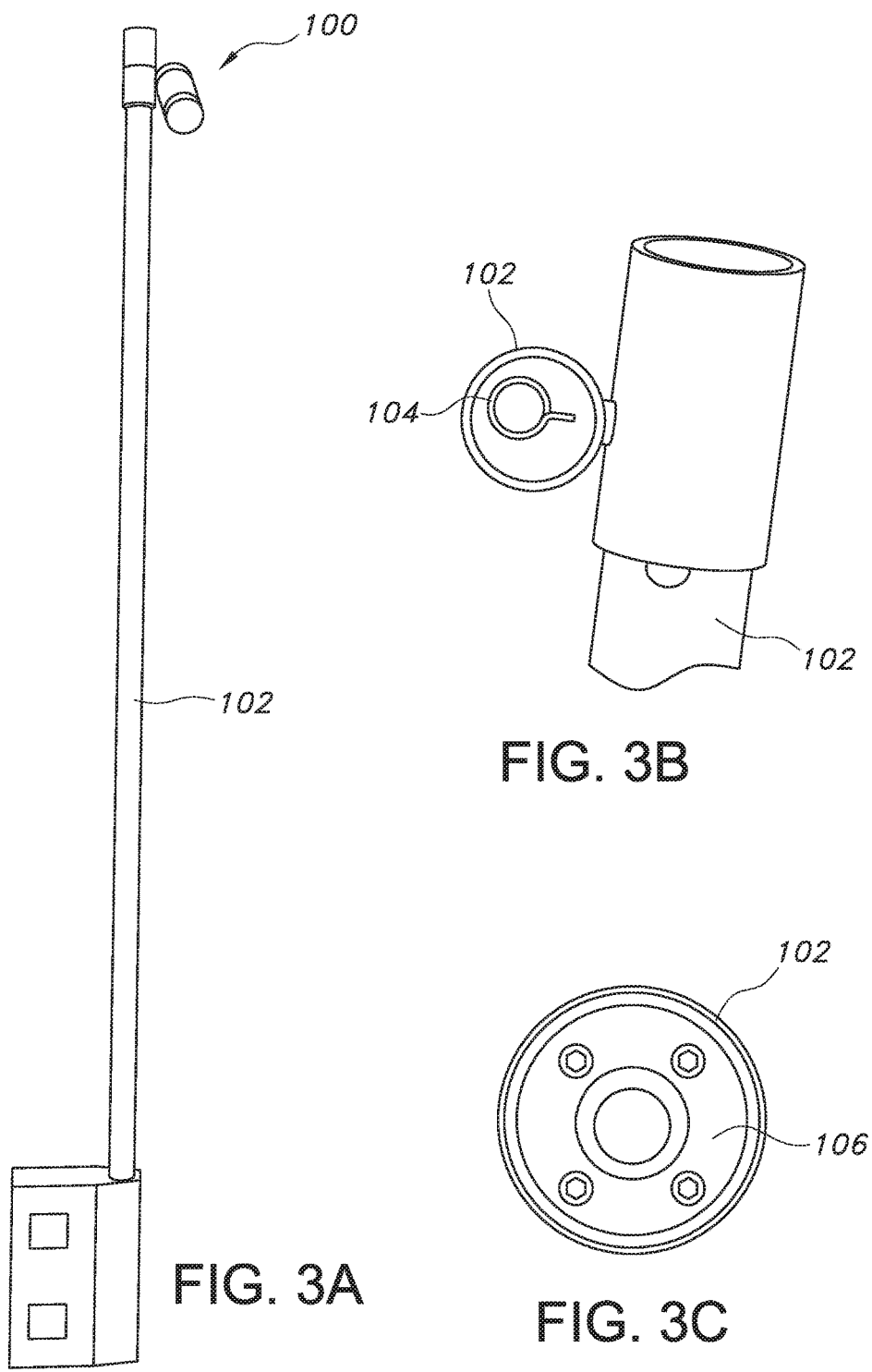

STATIC MULTIPLE-SAMPLE NMR PROBE

This document claims the benefit of U.S. Provisional Patent Application Ser. No. 62/086,300 filed Dec. 2, 2014, the full disclosure of which is incorporated herein by reference.

TECHNICAL FIELD

The present invention relates to NMR (nuclear magnetic resonance) probes. In particular, the invention relates to a static NMR probe including a plurality of magic angle spinning (MAS) modules for analysis of multiple samples. Because essentially complete radio-frequency (RF) isolation is provided between samples, the described probe eliminates the need for complicated RF signal isolation within the NMR magnetic field, meaning that samples can be placed very close to one another with no additional RF isolation needed, eliminating the need to physically move modules within the NMR magnetic field.

BACKGROUND OF THE INVENTION

Organizations such as pharmaceutical companies are increasingly turning to solid-state nuclear magnetic resonance spectroscopy (SSNMR) analysis, for example in testing low dose active pharmaceutical (API) formulations such as in blends and drug products. The low dose of the API results in long (24 hr+) experimental times, severely limiting throughput on a single spectrometer using a traditional SSNMR probe. This is because in conventional nuclear magnetic resonance (NMR) magnets solid-state NMR analysis must be done one sample at a time, and because of long delays between pulses, may require lengthy spectrum acquisition times. For most solid samples, less than one percent of the time in the magnetic field is spent on data acquisition. The rest of the time is spent waiting for the spin populations to return to their equilibrium value. During this time the sample must remain in a large static magnetic field, but is not required to be in a homogenous magnetic field. Moreover, a typical 400 MHz SSNMR instrument may cost around $600K, whereas a higher field instrument, such as an 800 MHz or 900 MHz spectrometer, can range from $2-5 MM.

Thus, conventional SSNMR is inherently an expensive, low throughput technique for the analysis of compounds, and because of the cost of current NMR machinery single sample analysis is undesirable. Any method that increases either the signal to noise ratio (SNR) and/or the throughput (number of samples analyzed per unit time) would be extremely beneficial. As alternatives to allow multi-sample analyses, 2 module and 4 module NMR probes have been developed (see U.S. Pat. Nos. 6,937,020 and 7,626,391 to Munson et al., the entirety of each of which is incorporated herein by reference) to attempt to maximize utilization of this expensive tool. While effective for their intended purposes, these probes disadvantageously require movement within the NMR magnet and/or provide insufficient isolation between samples being analyzed.

Specifically, three primary disadvantages have been identified for conventional NMR probe technology. The first is that the probe is constantly moving up and down in the magnet, which could be perceived negatively. Second, eddy currents caused by moving the probe up and down in the bore of the magnet were found to be problematic at high fields (>600 MHz), limiting the benefits of such probes to long-relaxing samples that allowed the eddy currents to die down. Finally, most high field NMR experiments are performed on protein samples, which typically have a relatively short (~1-3 s) recycle delay between repetitions. These samples do not benefit from such probes, and made this technology less interesting to solid-state NMR spectroscopists.

As an example, two-module multiple-sample probes (see U.S. Pat. No. 6,937,020) are known providing magic-angle spinning (MAS) modules that are 25 mm apart, although there is the capacity to change the distance if necessary. There is also the capability of tuning from the base of the probe, which is located outside the bore of the magnet. After extensive experimental testing it was observed that: 1) The signal-to-noise ratio for X nuclei such as $^{13}C$ is equivalent to that of a traditional $\lambda/4$ commercial probe design; 2) Proton power was comparable to a traditional coaxial probe design.

However, RF "crosstalk" between the two modules was observed. FIG. 1 shows $^{13}C$ CPMAS NMR spectra of 3-methylglutaric acid (MGA) obtained using the two-module probe of U.S. Pat. No. 6,937,020. As can be seen therein, isolation of the proton signal between the two sides of the probe was a challenge, resulting in the saturation of signal from one of the modules (D). The prior art solution was a passive feedback system (similar to an op-amp feedback mechanism). However, this approach could not be scaled to more than two MAS modules.

There is thus a need in the art for multi-sample NMR probes which allow acquisition of multiple spectra for improved throughput, without the disadvantages of prior art systems as described above. To satisfy this need in the art, a multi-sample probe is disclosed comprising multiple MAS modules. The described probe provides isolation of the entire RF circuit of each MAS module of the probe. Advantageously, the probe allows simultaneous SSNMR analysis of multiple samples, without requiring probe movement within the NMR magnetic field during sample acquisition.

SUMMARY

In accordance with the purposes and benefits described herein, in one aspect a static solid-state nuclear magnetic resonance (NMR) probe is described, comprising a plurality of probe subunits each configured for holding a sample. Each probe subunit comprises at least a magic angle spinning module, a radio-frequency (RF) coil, and an RF transmission line which together define an RF circuit, although other elements such as capacitors might also be present in the circuit. Moreover, each of the plurality of probe subunits is individually held in a self-contained conducting housing isolating the RF circuit of each probe subunit from any other of the plurality of probe subunits.

In embodiments, the probe comprises four or more probe subunits and therefore four or more MAS modules. The MAS modules may be placed in a vertically stacked configuration. In embodiments, the conducting housing is fabricated of copper or other suitable conducting material and may define an inner diameter of from about 0.30 to about 1 in. In embodiments, the MAS module defines an outer diameter of 1 in. or less.

In yet another aspect, a method for static analysis of a solid-state sample is described, comprising providing a solid-state nuclear magnetic resonance (NMR) as described above including a static solid-state NMR probe as described above. A spectrum is acquired from samples held within one or more MAS modules of the plurality of probe subunits. Advantageously, the spectrum is acquired without displacing any MAS module of the plurality of MAS modules within the bore during the step of spectrum acquisition.

In embodiments, the spectrum is acquired from the samples held within each MAS module simultaneously. In embodiments, samples are provided having a same nucleus or a different nucleus in one or more of the MAS modules.

In the following description, there are shown and described several preferred embodiments of the described multi-sample NMR probes and systems. As it should be realized, the probes, systems, and methods are capable of other, different embodiments and their several details are capable of modification in various, obvious aspects all without departing from the method as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the specification, illustrate several aspects of the disclosure and together with the description serve to explain certain principles thereof. In the drawing figures:

FIG. 3A depicts a solid-state NMR probe according to the present disclosure for use in SSNMR spectroscopy;

FIG. 3B depicts an RF coil disposed in the probe of FIG. 3A;

FIG. 3C depicts a MAS module for the probe of FIG. 3A;

Reference will now be made in detail to the disclosed multi-sample solid state NMR probe, examples of which are illustrated in the accompanying drawing figures.

DETAILED DESCRIPTION

As used herein, the terms "solid-state" and "sample" refer to any material, compound, or sample that is a solid or semi-solid. As used herein, "different samples" means samples contained within different MAS modules, which samples may comprise the same or a different nucleus. That is, the material being analyzed within the "different samples" may be the same or different between MAS modules. As used herein, the term "homogenous region" of a magnetic field means the region in a magnetic field in which, under MAS conditions, the line width as defined by full width at half height of a sample is below a threshold value of about 0.5 ppm.

A goal of the present work was to acquire MAS NMR spectra of multiple samples of the same nucleus with high (~0.1 ppm) resolution without requiring movement of the samples within the homogenous region of the magnet. As summarized above, a two-module probe developed by one of the present investigators (see U.S. Pat. No. 6,937,020) was somewhat effective for this purpose, but provided insufficient RF isolation (primarily on the proton side) between the two modules. This was determined to be primarily due to a common ground plane shared between the two module sides, especially in the tuning section of the probe. This problem could be partially addressed by obtaining active feedback of the module signal being pulsed to the other module. However, this solution was unduly complex. Moreover, the feedback solution did not address the issue of reduced sample throughput using a two-module probe.

To address these and other problems, in one aspect there is described herein a novel static multi-sample NMR probe allowing acquisition of multiple spectra without requiring probe movement within the NMR magnet during spectral acquisition. In an embodiment, a static multi-sample NMR probe is provided comprising four or more magic angle spinning (MAS) modules which increases sample throughput compared to conventional NMR probes having fewer modules, without requiring movement of the probe within the NMR magnet. Advantageously, by use of the presently described probe all modules of the probe can be placed in a homogenous region of the magnet, ensuring full RF isolation of each module without sacrificing performance. Further, the described probe includes a MAS spinning module having roughly half the diameter of current spinning modules. In other aspects, systems and methods for acquiring NMR spectra using the described probe are provided.

Example 1

Figure 2:
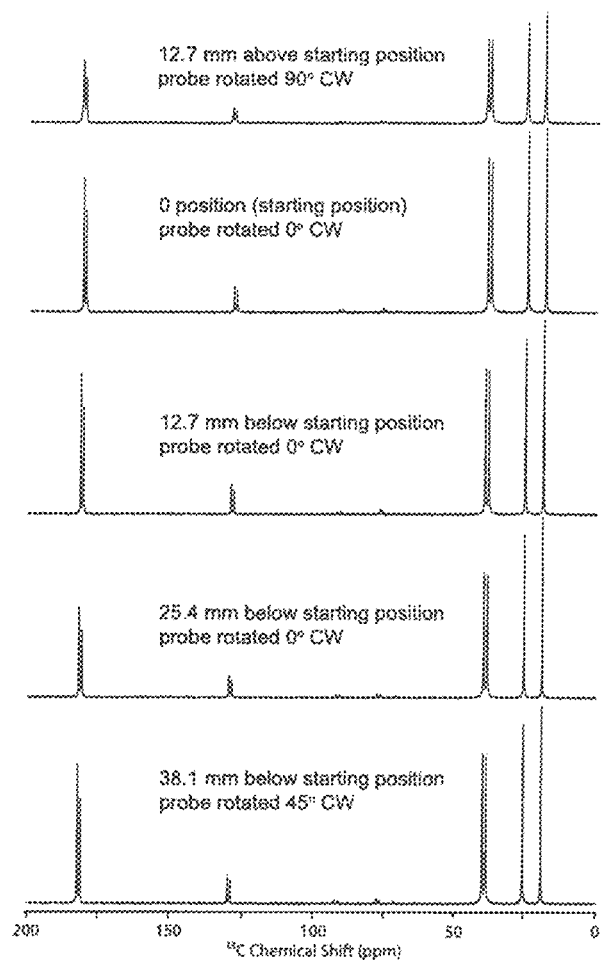
FIG. 2 shows acquired spectra of MGA using a MAS module at different physical locations in the NMR magnet.

Initial testing was conducted with $^{13}$C CPMAS NMR spectra of 3-methylglutaric acid acquired using standard conditions but at different positions in an NMR magnet bore (see FIG. 2). The spectra were acquired ~12.5 mm apart in this test, where the 0 position corresponded to the highest point in the magnet where a satisfactory high-resolution NMR spectrum could be acquired, and the point at ~38 mm was the lowest point in the magnet. An additional high-resolution NMR spectrum could be acquired at 12.5 mm above 0 if the probe is rotated by 90° in the magnet.

The criterion for a satisfactory MGA spectrum was that the SNR obtained for the sample was >200:1, which is comparable to the optimum SNR for an extremely narrow peak width. The SNR differences between positions reflects differences in width/shape of the peak, and so small peak broadening of these very narrow peaks will have a dramatic effect on the SNR ratio of the spectrum. This demonstrated the feasibility of placing more than two MAS modules in the homogeneous magnetic field of an NMR magnet, as long as there is sufficient RF isolation between the MAS modules. In this case, satisfactory spectra could be acquired from three or more MAS modules provided they could be properly RF isolated from each other, as long as the modules were spaced so that the centers of the top module and the bottom module were within about 40 mm of each other. The problem of providing sufficient RF isolation in a multi-module probe was exacerbated if the modules had to be spaced too close to one another.

Example 2

As noted above, preliminary work (see FIG. 2) revealed that satisfactory spectra could be acquired from multiple MAS modules without movement within the magnet during signal acquisition provided they could be properly RF isolated from each other. The present investigators have surprisingly found that isolation of the entire RF circuit solved this problem. Advantageously, by this design probes including three, four, five, or more MAS modules were made possible, depending on NMR rotor size, without needing to move the probe within the magnetic field during sample acquisition. This advantageously avoided the potential generation of large eddy currents as seen in prior art probe designs, and allowed more rapid switching speeds between modules.

Various technical challenges were considered in developing a static multi-sample NMR probe. First, a new magic-angle spinning (MAS) module design was highly desirable. In conventional NMR probes, the MAS module, which is needed to obtain high-resolution spectra, is relatively isolated from the rest of the probe by an isolation plate, and RF shielding is provided primarily by an aluminum sleeve that surrounds the probe. This avoids issues related to magnetic field homogeneity as well as space issues. For this reason prior art MAS modules had a diameter of ~4 cm. More recent designs have diameters around ~2 cm.

However, ideally a further reduction of size from ~2 to ~1 cm would increase the number of modules within the homogenous region of the magnetic field. Likewise, RF isolation between such modules was considered. Still more, spacing between modules was considered. Clearly, the closer the spacing between modules, the more samples would be able to be incorporated into the homogenous region of the NMR magnet. However, consideration had to be given to module spacing without negatively affecting RF homogeneity and power.

It was surprisingly found that providing a conducting housing shielding around the RF circuit (which would include at least the MAS module, the RF coil, and the RF transmission lines) solved the foregoing problems. FIGS. 3A-3C depict a single probe subunit 100 of a multi-sample probe according to the present disclosure, provided with such a conducting housing 102 fully shielding an RF transmission line (not visible in this view), an RF coil 104 (see FIG. 3B), and a MAS module 106 (see FIG. 3C) which in an assembled module 100 would contain the RF coil in an interior thereof. The RF transmission line and tuning elements 102 were fabricated of a suitable conducting material. As shown, the RF coil 104 was likewise shielded by the conducting housing 100. In one embodiment, copper was used, but other embodiments could utilize any conducting material that is non-magnetic. In one embodiment the conducting housing 102 is a copper cylinder having an inner diameter of from about 0.50 to about 0.75 in. It will be appreciated that the conducting housing 102 may define any suitable or desired different cross-sectional configuration shape (i.e. an oval or a rectangle). In another embodiment, the MAS module 106 has an outer diameter of 0.875 in. or smaller.

Figure 4A:
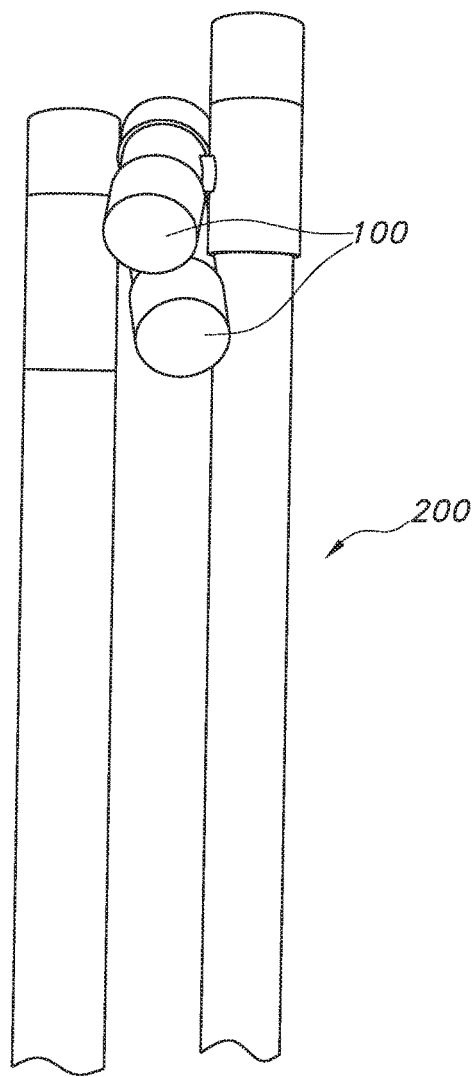
FIG. 4A depicts a front view of a multi-sample static NMR probe for use in SSNMR spectroscopy according to the present disclosure including two probe subunits.
Figure 4B:
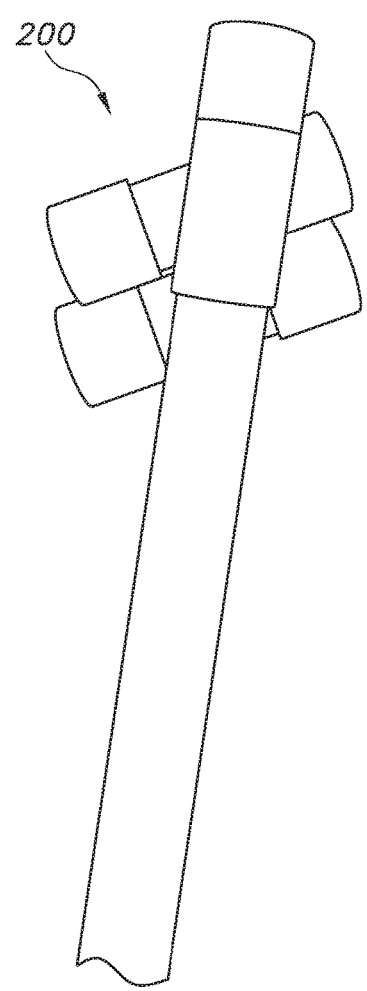
FIG. 4B depicts a side view of the NMR probe of FIG. 4A.

As will be appreciated, a plurality, i.e. three, four, five, or more probe subunits 100, each individually contained in a conducting housing 102 for full RF isolation as shown in FIG. 3, are combined to provide a static NMR probe 200 as will be described and as is shown in FIGS. 4A and 4B depicting two such probe subunits 100 so combined. Each MAS module 106 may include a rotor having a diameter less than or equal to about 7 mm (for example, 4 mm). In embodiments, the MAS modules 106 may be spaced apart in the completed probe, center-to-center, at about 13 mm or 16-17 mm. The RF coils 104 in an embodiment are constructed of copper (i.e. 16 AWG wire, 22 AWG wire, 1.5 mm wide flat foil, or 0.75 mm wide flat foil). Accordingly, when multiple probe subunits 100 are combined to provide a multi-sample static NMR probe 200, the conducting housing 102 provides full RF isolation and precludes cross talk between probe subunits by independently isolating each RF circuit (i.e. the MAS module, the RF coil, and the RF transmission line) inside its own housing 102.

Numerous advantages are realized by this probe 200 design. This probe design has the capability of increasing throughput by anywhere from a factor of 2-20, depending upon the number of spinning modules/samples that could be analyzed. There is little or no loss in field homogeneity, sensitivity, MAS speed, or $^1$H decoupling field strength compared to conventional NMR probes, nor is there a need to develop specialized spinning modules, pulse sequences, or RF technology. Further, the described probe can be used at any magnetic field strength, including at higher field strengths, where $T_1$ relaxation rates are much longer than at lower field strengths. Higher fields also imply faster spinning systems and therefore smaller sample volumes. This also means that more spinning systems could be placed in the static magnetic field, enabling more samples to be run.

Example 3

It was contemplated that RF performance would be affected by the shield diameter of the portion of the conducting housing 102 surrounding the RF coil 104. Table 1 shows signal to noise ratio (SNR) data for hexamethylbenzene (HMB) static spectra acquired using various copper tubing diameters (as conducting housing 102) and RF coils 104 in probes as shown in FIG. 3. The SNR of MGA and HMB was determined initially using a 7 mm rotor in a two-MAS module probe to ensure that the probe was operating properly, and then the SNR of a static HMB spectrum was obtained (Table 1A). The same HMB rotor was used for all subsequent measurements.

The SNR of the probe 200 shown in FIG. 4 was measured using a ¾ inch (i.d. 20.6 mm) copper tubing shield and an RF coil 104 constructed of 16 gauge wire, which was the same gauge used in the prior art two-MAS module probe. The SNR was comparable to that obtained with the prior art two-MAS module probe (Table 1B, C). A static multi-sample probe constructed using these diameters could accommodate three 7 mm MAS modules 106 (centers at 0, 20, and 40 mm), already a 50% improvement over the two-MAS module probe 200 shown in FIG. 4. However, in order to have four modules utilizing a 7 mm rotor, the spacing has to be ~13 mm center to center. An RF coil 104 wrapped with smaller diameter wire (22 gauge) and therefore smaller average coil diameter increased the SNR to about three quarters of the original SNR (E), as does a coil wrapped with copper foil (G). With smaller rotor diameters, such as 4 mm, four probe subunits or more are made possible.

TABLE 1

Signal to Noise ratios of HMB using different module sizes and wire dimensions.

| Design/Module | SNR Methyl Peak (Static) |
| --- | --- |
| (A) 2 Module Probe | 439 |
| (B) 20.6 mm ID Module/1.29 mm wire (16 AWG) Probe #1 | 431 |
| (C) 20.6 mm ID Module/1.29 mm wire (16 AWG) Probe #2 | 425 |
| (D) 14.5 mm ID Module/1.29 mm wire (16 AWG) | 224 |
| (E) 14.5 mm ID Module/0.64 mm wire (22 AWG) | 317 |
| (F) 14.5 mm ID Module/1.5 mm wide flat foil | 180 |
| (G) 14.5 mm ID Module/0.75 mm wide flat foil | 316 |

Figure 1:
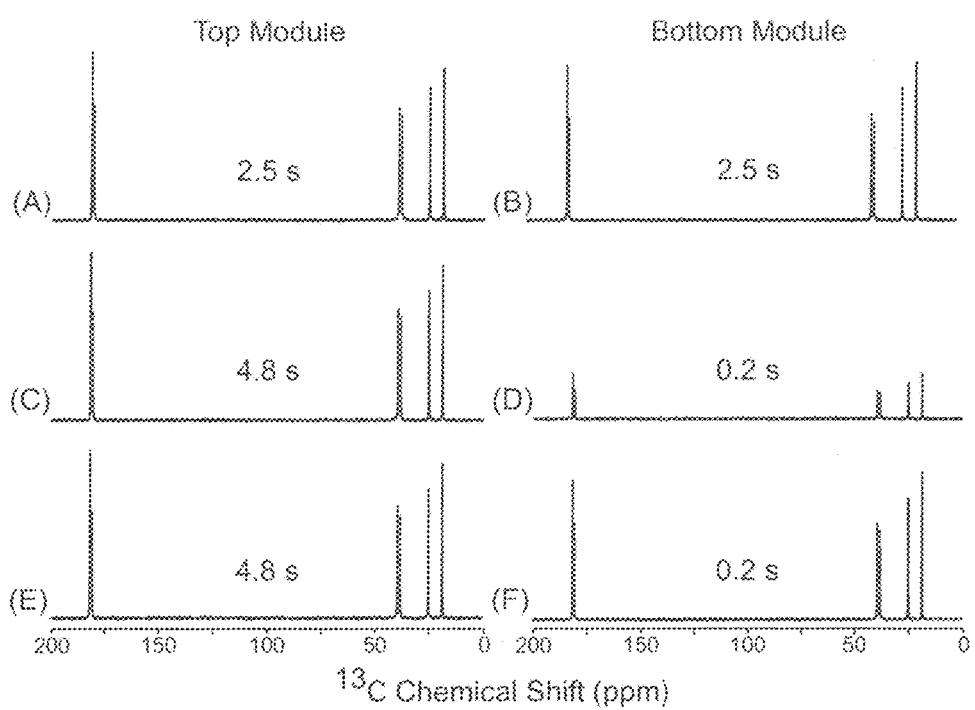
FIG. 1 shows acquired spectra of MGA using a prior art two magic-angle spinning (MAS) module probe.

RF isolation between the probe subunits was evaluated using a probe 200 including two RF coils and shield 200 and associated RF circuit being contained in an individual conducting housing 200 made of copper tubing as described above and as shown in FIGS. 4A and 4B. The design was very effective in RF isolation of the RF coils. Static CP spectra of mannitol and HMB were acquired in order to test isolation as shown below, comparable to the experimental data shown in FIG. 1. Since mannitol has a $^1H$ $T_1$ of ~50 s, a 1 s repetition delay between HMB and MGA acquisitions would saturate the mannitol signal. However, as shown in Table 2 there was no evidence of RF "cross-talk" between probe subunits of the probe 200, despite the fact that the ¾ inch copper tubing shields were separated by only by a thick piece of paper to ensure that they were not physically touching. From this testing, there was no cross talk between probe subunits.

TABLE 2

RF isolation testing between two fully shielded probes.

| Top Module Delay Mannitol-$^1H$ $T_1$ ~50s | Bottom Module Delay HMB-$^1H$ $T_1$ ~1s | Top Module Intensity Mannitol | Bottom Module Intensity HMB |
|---|---|---|---|
| 50 s | 50 s | 6703 | 11088 |
| 100 s | 1 s | 6921 | 11958 |
| 1 s | 100 s | 6578 | 9434 |
| 1 s | 200 s | 8726 | 11753 |

* 16 acquisitions, 68 ms acquisition time, and 42 kHz $^1H$ decoupling field for both samples.

Example 4

Figure 5:
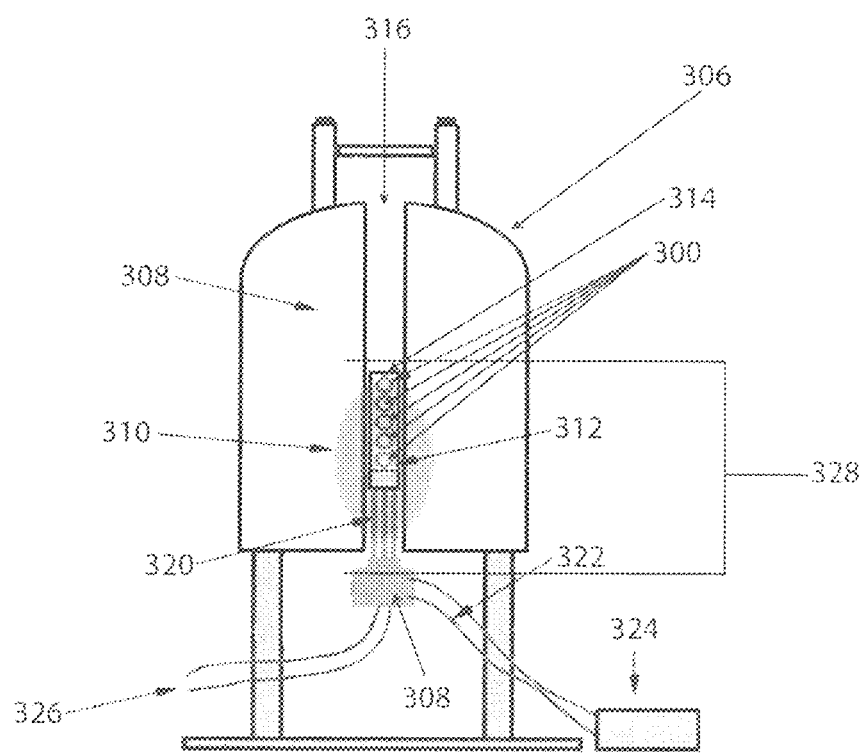
FIG. 5 illustrates an SSNMR spectrometer including a static magic-angle spinning (MAS) multiple sample NMR probe according to the present disclosure.

A solid-state NMR spectrometer 306 for use in SSNMR spectroscopy with an NMR probe according to the present disclosure is depicted in FIG. 5. A cryogen dewar houses an NMR magnet 308, which as is known creates a magnetic field including a strongest region 310 and a homogenous magnetic field region 312. A static multi-sample NMR probe 314 is provided, including a plurality of probe subunits including MAS modules 300. In the depicted embodiment, five MAS modules 300 are arrayed in a vertically stacked orientation, although inclusion of more or fewer probe subunits and therefore more or fewer MAS modules 300 is possible. The probe 314 is configured to statically hold the MAS modules 300 within a bore 316 of the magnet 308 and in the homogeneous region 312 of the magnet for signal acquisition.

RF transmission lines 320 connect the probe 314 to RF input lines 322 and therefrom to a remote RF tuning device and switching box 324. Gas lines 326 are coupled to the probe 314 to provide drive and bearing gas for the sample holders (not shown) contained in the MAS modules. As depicted, each MAS module 300 includes its own separate gas lines 326, RF circuit 328 [RF coil (not shown), MAS module 300, and RF transmission lines 322], and magic-angle adjustment mechanism (not shown). However, it is contemplated that some or all of these features may be combined.

As depicted in FIG. 5, the probe tuning elements are located at the bottom of the probe 314. This serves two purposes. First, each MAS module 300/RF circuit 328 can be selected independently for signal acquisition. Second, it allows each RF circuit 328 to be tuned independently outside of the magnet 308. Each MAS module 300 may have independent variable-temperature capability, independent spinning speed control, and independent shimming parameters.

The foregoing description has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the foregoing description and appended claims when interpreted in accordance with the breadth to which they are fairly, legally and equitably entitled.

What is claimed:

1. A static solid-state nuclear magnetic resonance (NMR) probe, comprising:
 a plurality of probe subunits each configured for holding a sample, each probe subunit comprising at least a magic angle spinning (MAS) module, a radio-frequency (RF) coil and an RF transmission line together defining an RF circuit;
 wherein each of the plurality of probe subunits is individually held in a conducting housing isolating the RF circuit of each probe subunit from any other of the plurality of probe subunits.

2. The static NMR probe of claim 1, comprising four or more probe subunits.

3. The static NMR probe of claim 1, wherein the conducting housing is fabricated of copper.

4. The static NMR probe of claim 1, wherein the MAS modules of the plurality of probe subunits are placed in a vertically stacked configuration.

5. The static NMR probe of claim 1, wherein the conducting housing defines an inner diameter of from about 0.30 to about 1 in.

6. The static NMR probe of claim 1, wherein the MAS module defines an outer diameter of 1 in. or less.

7. A solid-state nuclear magnetic resonance (NMR) spectrometer, comprising:
 a magnet defining a bore; and
 a static solid-state NMR probe comprising a plurality of probe subunits each configured for holding a sample, each probe subunit comprising at least a magic angle spinning module, a radio-frequency (RF) coil and an RF transmission line which together define an RF circuit, wherein each of the plurality of probe subunits is individually held in a conducting housing isolating the RF circuit of each probe subunit from any other of the plurality of probe subunits.

8. The solid-state NMR spectrometer of claim 7, comprising a static NMR probe including four or more probe subunits.

9. The solid-state NMR spectrometer of claim 7, wherein the conducting housing is fabricated of copper.

10. The solid-state NMR spectrometer of claim 7, wherein the MAS modules of the plurality of probe subunits are placed in a vertically stacked configuration.

11. The solid-state NMR spectrometer of claim 7, wherein the conducting housing defines an inner diameter of from about 0.50 to about 0.75 in.

12. The solid-state NMR spectrometer of claim 7, wherein the MAS module defines an outer diameter of 1 in. or less.

13. A method for static analysis of a solid-state sample, comprising:

providing a solid-state nuclear magnetic resonance (NMR) spectrometer comprising a magnet defining a bore and generating a magnetic field;

providing a static solid-state NMR probe comprising a plurality of probe subunits each configured for holding a sample, each probe subunit comprising at least a magic angle spinning (MAS) module, a radio-frequency (RF) coil and an RF transmission line which together define an RF circuit, wherein each of the plurality of probe subunits is individually held in a conducting housing isolating the RF circuit of each of the probe subunits from any other of the plurality of probe subunits; and acquiring a spectrum from samples held within one or more MAS modules of the plurality of probe subunits.

14. The method of claim 13, including acquiring the spectrum without displacing any MAS module of the plurality of probe subunits within the bore during the step of spectrum acquisition.

15. The method of claim 14, including acquiring the spectra from the samples held within each MAS module simultaneously.

16. The method of claim 13, including providing an NMR probe including four or more probe subunits.

17. The method of claim 13, including providing an NMR probe including four or more probe subunits whereby the associated MAS modules are arranged in a vertically stacked orientation.

18. The method of claim 13, including providing samples having a same nucleus in one or more of the MAS modules.

19. The method of claim 13, including providing samples having a different nucleus in one or more of the MAS modules.

* * * * *